United States Patent [19]

Kapitulnik

[11] Patent Number: 5,219,826
[45] Date of Patent: Jun. 15, 1993

[54] SUPERCONDUCTING JUNCTIONS AND METHOD OF MAKING SAME

[75] Inventor: Aharon Kapitulnik, Palo Alto, Calif.

[73] Assignee: Conductus, Inc., Sunnyvale, Calif.

[21] Appl. No.: 569,434

[22] Filed: Aug. 20, 1990

[51] Int. Cl.⁵ .............................. H01L 21/00
[52] U.S. Cl. ...................... 505/1; 156/667; 156/646; 156/643; 505/702; 505/728; 427/63
[58] Field of Search ............... 505/701, 702, 728; 427/62, 63; 156/643, 646, 655, 656, 667

[56] References Cited

U.S. PATENT DOCUMENTS

| | | | |
|---|---|---|---|
| 3,911,333 | 10/1975 | Notarys et al. | 505/874 |
| 4,343,993 | 8/1982 | Binnig et al. | 505/848 |
| 4,785,189 | 11/1988 | Wells | 427/43.1 |
| 4,829,507 | 5/1989 | Kazan et al. | 369/126 |
| 4,896,044 | 1/1990 | Li et al. | 250/492.3 |
| 4,966,885 | 10/1990 | Hebard | 505/1 |
| 5,015,323 | 5/1991 | Gallagher | 156/643 |
| 5,021,672 | 6/1991 | Parkinson | 250/492.2 |

FOREIGN PATENT DOCUMENTS 62-232333  3/1987  Japan .
63-060196  3/1988  Japan .

OTHER PUBLICATIONS

"Atomic-scale surface modifications using a tunneling microscope"; *Letters to Nature;* Becker et al.; Nature; vol. 325; Jan. 29, 1987; pp. 419–421.

"Topography and local modification of the HoBa$_2$Cu$_3$O$_{7-x}$(001) surface using scanning tunneling microscopy"; *Appl. Phys. Lett;* 53(24); Heinzelmann et al.; Dec. 12, 1988; pp. 2447–2449.

Cui et al.; "Josephson Devices Fabricated With High TC YBaCuO Thin Films"; *International Journal of Modern Physics;* vol. 1, No. 2 (1987), pp. 541–546.

Koch et al.; "Quantum Interference Devices Made From Superconducting Oxide Thin Films"; *Appl. Phys. Lett.,* vol. 51, No. 3, Jul. 20, 1987, pp. 200–202.

"Nanometer lighography with the scanning tunneling microscope"; *Appl. Phys. Lett.;* 46(9); Ringger et al.; May 1, 1985, pp. 832–834.

"Scanning Tunneling Microscopy and Nanolithography on a Conducting Oxide, Rb$_{0.3}$MoO$_3$"; *Science;* vol. 246, Oct. 6, 1989; Garfunkel et al.; pp. 99–100.

"Direct writing in Si with a scanning tunneling microscope"; *Appl. Phys. Lett.;* 55(13); Sep. 25, 1989; van Loenen et al.; pp. 1312–1314.

Pandey et al.; "Direct Laser Beam Writing on YBaCuO Film for Superconducting Microelectronic Devices"; *Japanese Journal of Applied Physics;* vol. 27, No. 8, Aug. 1988, pp. L1517–L1520.

Primary Examiner—Brian E. Hearn
Assistant Examiner—George Goudreau
Attorney, Agent, or Firm—Marvin E. Jacobs

[57] ABSTRACT

A superconducting Josephson junction is created in high $T_c$ superconducting film, with a bridge connecting two superconducting banks, by subjecting the bridge to a tunneling electron current from a sharp electrode close to the bridge. The tunneling current alters the structure over atomic dimensions to create a weak link of length comparable to high $T_c$ coherence lengths so as to permit phase coherent Cooper pair current flow across the weak link.

12 Claims, 1 Drawing Sheet

SUPERCONDUCTING JUNCTIONS AND METHOD OF MAKING SAME

DESCRIPTION

1. Technical Field

The invention concerns the production of non-linear electronic devices from superconductor junctions and more particularly to the creation of such junctions using higher critical temperature ($T_c$) materials.

2. Background of the Invention

Superconducting materials have zero resistance to electrical current flow when operated at suitably low temperatures. If a gap or insulating barrier is formed in the superconductor, current can still flow across the barrier in response to an applied voltage, by means of electron tunneling, provided the gap is sufficiently narrow. If the applied voltage is increased from zero, there is no current flow until the voltage reaches a threshold level, at which time tunneling current quickly begins so that a very non-linear device is achieved. An additional interesting characteristic of one type of these devices, which are known as Josephson junctions, is that a supercurrent can flow across the gap when there is no voltage at all. This effect is encountered for very thin insulating barriers. Josephson junctions have a large number of useful applications because the supercurrent flow is very sensitive to magnetic fields and can be switched off by exceeding a critical value.

The traditional way of making Josephson junctions has been to create a sandwich or layered structure. A suitable low $T_c$ superconductor such as tin is deposited on a substrate in the shape of a conducting strip. Then a thin tunnel barrier insulator such as tin oxide is formed on top of the strip. Finally, a second superconductor is deposited over the thin tunnel barrier resulting in two superconducting metal strips spaced by the thickness of the barrier material.

Another prior art approach is to deposit a single layer of superconducting material on a substrate and then open a gap in the superconductor with photolithographic techniques. A resist material is formed on the superconductor, exposing the area of the intended gap. The gap material is then removed by etching, or perhaps ion milling, and the gap filled again with a metal such as gold. The resulting superconductor-normal metal-superconductor (SNS) junction operates to pass supercurrent on the basis of a phenomenon referred to as the proximity effect. When the proximity effect is involved, a weak superconductivity is induced in the gold by the superconductivity of the adjacent superconductors. The gold becomes a "weak link" in the superconducting current flow, very sensitive to any external destabilizing influences such as applied magnetic and electric fields. Thus, weak links are excellent detectors in a variety of applications.

To make weak links, it is not necessary to first create gaps and refill them with gold, however. Weak links can also be created by altering a portion of the superconductor for a short distance so as to weaken its superconductivity. This may be done, for example, by narrowing the superconductor at the chosen location, which increases the current density at that location. Since superconductivity is progressively extinguished as a critical current level is approached, a narrower portion suppresses superconductivity.

These narrow portions are referred to as bridges-, and the larger remaining superconductors on each side, that the bridges connect together, are referred to as banks. The present invention is concerned with the production of bridge type weak links which are preferred over SNS weak links so as to avoid the use of metal and the problems associated with the interfaces between the metal and the superconductor.

For low $T_c$ superconductors, traditional fabrication techniques suffice to build SNS or weak link structures because the proximity effect extends for a sufficient distance that the bridge or gap lengths are within the capabilities of traditional fabrication methods. However, for recently discovered high $T_c$ materials the production of bridge type Josephson junctions is much harder.

Newer, high $T_c$ materials have been discovered that begin to superconduct at temperatures in the range of 90° K. to over 120° K. Even higher critical temperatures are anticipated in the future. These high $T_c$ superconductors are much preferred over the low $T_c$ superconductors of the past due to the easier cooling requirements in their use. High $T_c$ superconductors are generally of a class of compounds called perovskites. This connotes a type of crystal structure. Copper-oxygen planes are found in the high $T_c$ superconductors that support the resistance-free current flow. Typical examples include compounds of YBaCuO, LaSrCuO, BiSrCaCuO, and TlBaCaCuO where the formulas are not intended to specify the ratios of the individual elements.

The most popular of these compounds, as of this writing, is $YBa_2Cu_3O_{7-x}$ where x is a number from 0 to 1. But for the purposes of this application, high $T_c$ superconductors are defined to be any of the copper oxide systems described, and also other high $T_c$ compounds that behave in a similar fashion.

The best quality copper oxide compounds, those that are reliably reproducible, are formed by deposition in controlled environments onto substrates. When formed in this manner, the high $T_c$ compounds can be made to grow in a crystalline structure such that the copper oxygen planes are parallel to the substrate surface. Since superconductivity is much more prevalent in the copper oxygen planes, the resulting layer of superconductor is very anisotropic, having a higher current carrying ability parallel to the substrate than perpendicular thereto.

The most accepted current theory of superconductivity relates the phenomenon to the pairing of electrons in a quantum mechanical sense. The paired electrons are referred to as Cooper pairs, each electron coupling to another electron that happens to be in a time reversed state relative to the first electron. That is to say, the paired electrons have opposite quantum characteristics with respect to spin and momentum. Coherence length can be thought of as the average distance between paired electrons in a given material. For instance, aluminum has a coherence length of about 3500 angstroms whereas niobium is more in the range of 200 angstroms.

Coherence length is an important parameter in the construction of superconducting weak link bridge type Josephson junctions. The weak link should be on the order of a few coherence lengths long for the best operation. The largest bridge allowable might be on the order of ten coherence lengths. This creates a problem for high $T_c$ superconductors. Coherence lengths, in general, become shorter for materials that transition to the superconduction state at higher temperatures. For example, YBaCuO which has a $T_c$ of around 90° K., has a coherence length of only about 15 angstroms in the inplane ab-axis and in the interplanar c-axis direction the coherence length is still smaller, about 2 angstroms. Producing a weakened region, even in the larger 15 angstrom coherence length ab-axis is beyond the capabilities of state-of-the-art methodologies.

Practical electronic devices will probably be economical only if a large array of such devices can be produced at one time on a single substrate in the fashion of semiconductor manufacturing methods. Making one junction at a time, coupled no doubt with a low yield of usable product, will undoubtedly prevent the practical fabrication of reasonably priced high $T_c$ junctions. It is to these problems that the present invention is addressed. A new and novel approach to patterning technology is proposed that overcomes the limitations inherent in the low coherence length, high critical temperature superconductors.

SUMMARY OF THE INVENTION

Briefly, the present invention contemplates the production of a Josephson junction by forming a single thin layer of high $T_c$ superconductor on a substrate and narrowing down a portion of the superconductor so as to create a bridge between the two larger banks of superconductor. This bridge portion is then modified, at an atomic scale, with the application of an externally applied tunneling electron current so as to create a barrier. The tunneling current flows from a sharp metal electrode placed very close to the surface of the bridge. The electrode may be moved over the surface of the bridge by suitable servomechanisms controlled, in turn, by computer assisted control circuits.

The use of tunnel current provides the advantage that the electron beam that modifies the atomic structure is confined to a precise location. This location is comparable in size to atomic dimensions and thus introduces a weak link in the high $T_c$ material on the scale of atomic dimensions. The reason this happens is because the flow of electrons by tunneling is extremely dependent on the length of the gap between the electrode and the bridge. In fact, the flow is exponentially related to the length of the gap. An electrode that appears to be very sharp at a macroscopic level will be found to be quite irregular on an atomic scale. Usually, somewhere on the point of the electrode there will be a group of atoms, or perhaps even one atom that projects out further than the rest. This atomic scale point will therefore be somewhat closer to the surface of the bridge. This difference in closeness has a radical effect on the tunneling current so that substantially all of the tunneling current will flow through the atomic point, thus, confining the electron flow to the location of the atomic point. This electron flow may be used to alter the physical structure of the crystal lattice that makes up the high $T_c$ material so that the superconducting state is suppressed. A weak link can be written across the bridge by moving the electrode thereacross. This weak link between the two adjacent superconducting banks results in a Josephson type junction.

Several different mechanisms are contemplated for the invention. Material can be removed from the bridge area so as to decrease the size of the bridge and form a weak link. Alternatively, the bridge can be chemically altered by using the tunnel current electrode to remove oxygen from the crystal using the electrode potential. Another variation is to write in an erosion enhancing atmosphere of acid vapor or the like. Further possibilities, benefits, and advantages will become apparent upon consideration of the following detailed description and drawings.

DETAILED DESCRIPTION OF THE INVENTION

Figure 1:
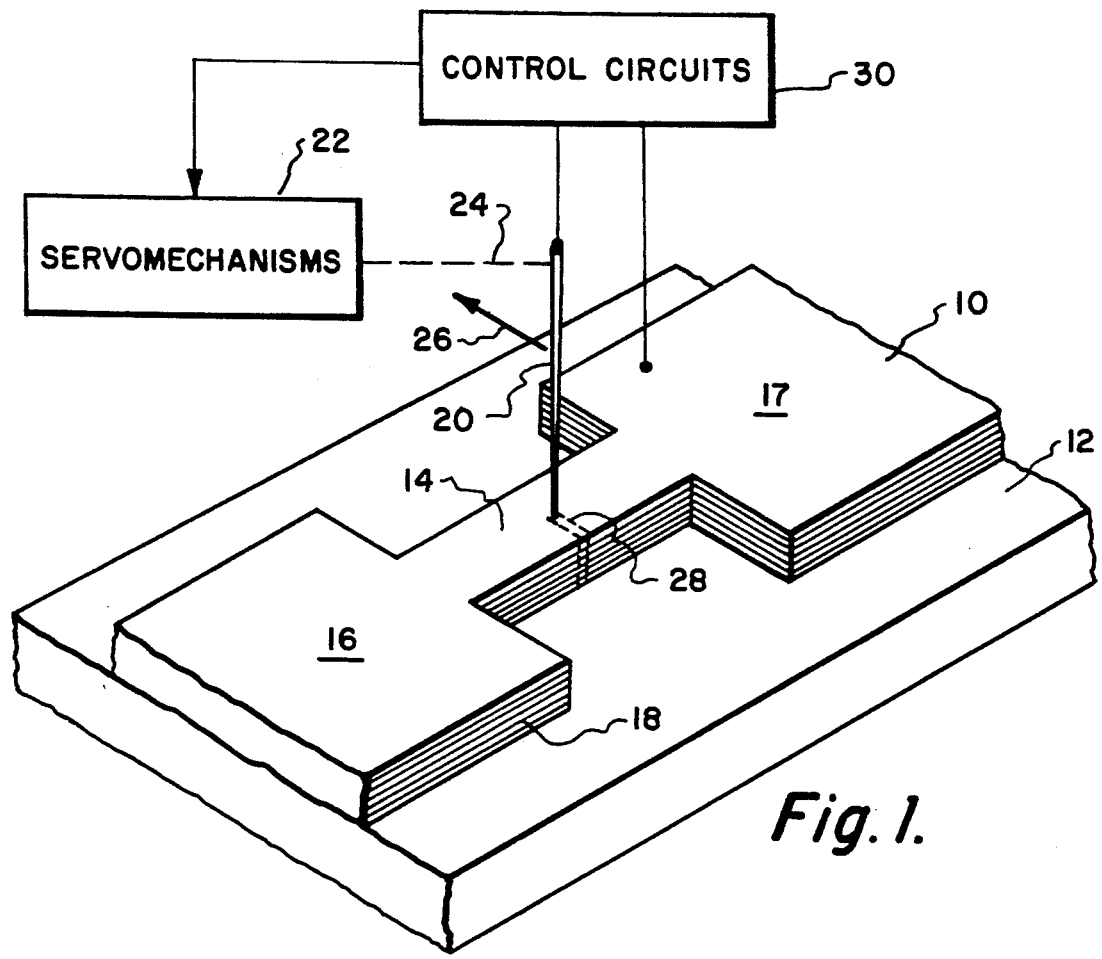
FIG. 1 is a perspective view of a fragmentary portion of a superconducting strip, showing the junction being formed, with schematic representations of the writing electrode.

FIG. 1 shows schematically a high $T_c$ superconducting film 10 formed on a substrate 12. To achieve the highest quality and most homogenous superconductor, the material should be formed by carefully depositing the constituent components of the selected superconductor from a vapor phase onto a substrate such as lanthanum aluminate. Such a substrate has an ideal crystalline structure for encouraging the expitaxial growth of the high $T_c$ superconductor film. Such a process can be carried out, for example, by vaporizing a sample of the desired material, having the correct stoichiometric proportions, in a vacuum chamber proximate substrate 12 using laser ablation, sputtering, or other appropriate vaporization techniques. Such a process, in which the films condense directly from the vapor into the desired structure as they are grown, is called in situ growth and has been found to produce films with good consistent properties even though the films are very thin. It is possible to produce films as thin as sixty angstroms that are superconducting. This approach yields films that are not dominated by naturally occurring weak links, as was the case for films made by non in-situ processes, and thus it becomes possible to introduce a weak link at a desired location so as to form a Josephson junction.

As shown in FIG. 1, film 10 has a narrow bridge portion 14 connecting together a pair of superconducting banks 16 and 17. The width and thickness of bridge 14 are chosen to sustain superconductivity in a manner well known to those skilled in the art. For example, bridges approaching one micron in width can be patterned using wet or dry etching methods.

Film 10, formed as described, normally grows so as to have copper oxide planes that are parallel to the surface of substrate 12. These planes are schematically suggested in FIG. 1 by parallel lines 18. It is along planes 18 that the larger coherence length is found. Thus, the best way to form a weak link is across planes 18 in the bridge 14. In the present invention it is proposed to create this weak link with an electrode 20 positioned very close to, but not contacting, bridge 14. Suitable servomechanisms 22, connected to electrode 20 by means of suitable mechanical or electrical means, shown as dashed line 24 in FIG. 1, are used to move electrode 10 across bridge 14 as shown by arrow 26. The path of altered or damaged film is shown by dashed lines 28. The damaged film creates a weak link in the superconducting circuit across which the superconductivity phenomenon is suppressed.

FIG. 1 also shows suitable control circuits 30 connected so to direct servomechanisms 22 over the desired path, perhaps in response to a computer program. Control circuits 30 are also shown connected to film 10 and electrode 20 so as to maintain a voltage on electrode 20, relative to film 10, of magnitude such that a tunneling current exists from the tip of electrode 20 to bridge 14. The control circuits 30, servos 22, connections 24, and electrode 20 all comprise readily available technology since they comprise generally the same components used in scanning tunneling microscopes. These microscopes are used to study the surface atomic structures of a wide variety of conducting materials. Basically, in use, a sharp electrode is tracked across the surface of the specimen by position controlling devices under computer control. The electrode is adjusted to maintain a distance from the specimen such that a constant tunneling current to the specimen is maintained. Monitoring the varying position of the electrode provides insight into the shape of the surface at an atomic scale. This microscope technology is directly usable in the practice of the present invention.

Electrode 20 is chosen to be a material having a large density of electron states at the Fermi energy so as to provide tunneling electrons to the process.

The electron beam that emanates from the tip of electrode 20 will be extremely narrow since it comes primarily from the one or two atoms on the tip of electrode 20 that are closest to bridge 14. Any other secondary sources of tunneling electron current that are further away from bridge 14 will be exponentially smaller. The absolute difference in current flow between these primary and secondary sources can, in principle, be made as large as desired by moving the electrode 20 closer to bridge 14. Thus, a very narrow path of damage 28 becomes feasible, approaching dimensions on the order of atomic scale and crystal lattice spacing distances. The ability to alter the crystal structure along a path 28 at these extremely small dimensions allows the formation of a weak link in high $T_c$ materials. This formation can be effected in several ways as contemplated by the instant invention.

Figure 2:
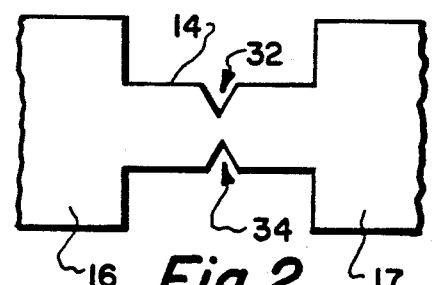
FIG. 2 shows one device configuration possible with the method of the present invention.

One way is shown in FIG. 2 where bridge 14 is notched from the sides, at 32 and 34, leaving a narrow weak link of material in the middle. It will be seen that superconducting material can actually be removed from bridge 14. The electron beam from electrode 20 is an intense energy source available to support a variety of structure altering processes. Clearly, enough current for a sufficient time will physically strip atoms from the material thus eroding the material away. A more subtle approach is to take advantage of the chemical characteristics of the superconductor. High $T_c$ superconductors of the copper oxide family are susceptible to the loss of oxygen from the crystal lattice structure. Oxygen can be induced to migrate out of the crystal over the path 28 by using the electrode at a positive potential to act on the negatively charged oxygen ions. This will impair the crystals ability to superconduct.

Still another variation is to write the path 28 using a tunneling current electrode in the presence of an erosion enhancing atmosphere containing a vapor that will react with one or more of the elements comprising the crystal structure. For example, an acid such as nitric acid would more readily react with atoms in the structure in the presence of the electron beam. The electron beam operates to enhance the chemical reactions in a very localized area. Extending this concept, the gap could be made larger, and the chemical alteration used to change the superconductor into a normal metal with a longer coherence length, thus, creating a SNS type junction. Any of these processes may be used to alter or damage the superconductor over a narrow region and thereby create a weak link.

Figure 3:
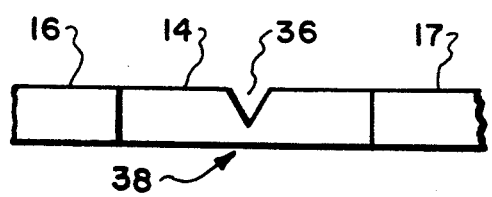
FIG. 3 shows another device configuration.
Figure 4:
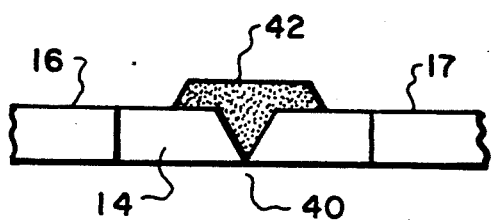
FIG. 4 shows an alternative device configuration using a noble metal weak link.

FIG. 3 shows how bridge 14 could be eroded across the top at location 36 so as to leave behind a weak link connection 38 at the bottom. Alternatively, the notch could be carried through bridge 14 to point 40, as in FIG. 4 and the weak link created with a noble metal 42 such as gold deposited on top. An interesting benefit of this approach is that the gold can be deposited from the electrode 20 if a gold tip is used on the electrode.

Of course, the electrode tunnel current electron beam is also suitable to erode or produce larger barriers as well if desired. Such junctions would have more exact tolerances than can be had from photolithographic, focused electron beam, or focused ion beam methods.

Figure 5:
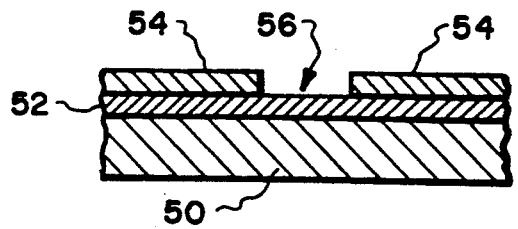
FIG. 5 shows another embodiment more suitable for lower $T_c$ materials.

For example, FIG. 5 shows a substrate 50 having a layer 52 of metal such as copper and a top layer of lower $T_c$ material 54, perhaps niobium. A gap 56 is written in superconducting layer 54 by a tunnel current from electrode 20. The copper layer 52 connects the two superconducting banks 54 to form a SNS junction. Gap 56 may be made larger than the previously described barriers since the coherence length in niobium is longer. The device of FIG. 5 is useful but must be operated at much lower temperatures. Thus, not all of the benefits of the present invention are realized. To appreciate all of these additional benefits, a brief consideration of the pertinent theory is appropriate.

Superconductivity relies upon the establishment of long range organized quantum behavior of the electrons over macroscopic distances. If this long range order is maintained across a discontinuity or weak link, the phase of the overall wavefunction in one superconductor is held in a fixed relationship with the phase of the wavefunction in the other superconductor. This phase coherence across a weak link defines a Josephson junction. With phase coherence comes zero resistance flow across the junction even with no applied voltage. Phase coherence is, however, a fragile condition. The weak link is easily disturbed by small currents and magnetic fields. This makes a Josephson junction a very good detector of slight currents and magnetic fields. But if phase coherence is lost, the device reverts to an ordinary junction, requiring an applied voltage to initiate current flow. Phase coherence is only possible when the weakened zone is on the order of a few coherence lengths long, and as described earlier, the coherence length for high $T_c$ materials is much shorter. The present invention provides a way to generate weak link structures of a size corresponding to the coherence lengths typical of the new high critical temperature superconductor materials. As a result Josephson junction devices can be created that will operate at much higher and more obtainable temperatures.

A further advantage of the instant invention arises from the fact that the computer program that positions electrode 20, through control circuits 30, can also be tailored to write not just one junction, but an array of junctions over a large superconductor circuit grown at one time on a substrate. Thus, multiple devices can be simultaneously formed as opposed to the one-at-a-time approach inherent in the prior art.

Since other variations will be possible in the implementation of the present invention that do not depart from the spirit and scope of the disclosed product and process, I intend to be limited only to the following appended claims.

I claim:

1. A method of making Josephson junctions in high critical temperature superconductors comprising the consecutive steps of:

first forming a layer of high Tc copper oxide superconductor on a substrate by forming the constituent components of the superconductor onto the substrate so as to epitaxially grow the superconductor on the substrate with copper-oxygen planes parallel to the surface of the substrate, said layer formed in a pattern to create a desired electronic circuit;

then narrowing selected portions of the superconductor circuit at locations where Josephson junctions are desired;

then creating weak link areas at said selected portions by moving an electrode across the surface of said selected portions, generally from one side of the selected portion to the other side of the selected portion, at a distance from the surface suitable to maintain a tunnel current between the electrode and the selected portion and maintaining said tunnel current directly into said junction locations while the electrode is proximate to the selected portions and sustaining said tunnel current through the electrodes long enough to physically remove superconducting material from the selected portion; and then depositing a noble metal in the selected portion by evaporating an electrode made from the noble metal.

2. The method of claim 1 in which the electrode is moved from one side of the selected portion to the other side of the selected portion so as to alter the crystal structure in a very narrow path of width in the range of one to about 10 coherence lengths for the superconductor.

3. The method of claim 1 in which the electrode is moved over part of the selected portion so as to narrow the superconductor in the area of the selected portion and create a weak link.

4. The method of claim 1 in which the electrode is operated at a positive potential so as to induce oxygen to migrate out of the selected portion so as to create a weak link.

5. The method of claim 1 including the step of maintaining an erosion enhancing environment around the selected portion while the tunnel current is maintained.

6. The method of claim 1 in which the crystal structure is altered in the selected portions only to a depth that does not extend all the way through the selected portions so as to preserve the superconducting layer near the substrate.

7. A method of making superconducting Josephson junctions comprising the consecutive steps of:

first forming circuits of high Tc copper oxide superconductor on a substrate by depositing the constituent components of the superconductor onto the substrate so as to epitaxially grow the superconductor circuits on the substrate with copper-oxygen planes parallel to the surface of the substrate;

then creating weak links where Josephson junctions are desired by moving an electrode across the surface of selected portions of said circuits in a direction generally orthogonal to the flow of current in said circuits at a distance from the surface suitable to maintain a tunnel current between the electrode and the selected portion and maintaining said tunnel current directly into said selected portions while the electrode is proximate to the selected portions and sustaining the tunnel current through the electrode long enough to physically remove superconductor material from the selected portion; and then depositing a noble metal in the selected portion by evaporating an electrode made from the noble metal.

8. The method of claim 7 in which the electrode is moved from one side of the selected portion to the other side of the selected portion so as to alter the crystal structure in a very narrow path of width in the range of one to about 10 coherence lengths for the superconductor.

9. The method of claim 7 in which the electrode is moved over part of the selected portion so as to narrow the superconductor in the area of the selected portion and create a weak link.

10. The method of claim 7 in which the electrode is operated at a positive potential so as to induce oxygen to migrate out of the selected portion so as to create a weak link.

11. The method of claim 7 including the step of maintaining an erosion enhancing environment around the selected portion while the tunnel current is maintained.

12. The method of claim 7 in which the crystal structure is altered in the selected portions only to a depth that does not extend all the way through the selected portions so as to preserve the superconducting layer near the substrate.

* * * * *